(12) United States Patent
Hoon et al.

(10) Patent No.: US 7,230,452 B2
(45) Date of Patent: Jun. 12, 2007

(54) DRIVER CIRCUIT

(75) Inventors: Siew Kuok Hoon, Dallas, TX (US);
Franco Maloberti, Torre d'Isola (IT);
Jun Chen, Allen, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 130 days.

(21) Appl. No.: 11/112,267

(22) Filed: Apr. 22, 2005

(65) Prior Publication Data
US 2006/0239082 A1 Oct. 26, 2006

(51) Int. Cl.
*H03K 19/0175* (2006.01)

(52) U.S. Cl. .......................................... 326/83; 326/86
(58) Field of Classification Search ................. 326/68, 326/82–87
See application file for complete search history.

(56) References Cited

U.S. PATENT DOCUMENTS

| 5,896,043 | A  | * | 4/1999  | Kumagai ..................... 326/68 |
| 6,246,263 | B1 |   | 6/2001  | Baker |
| 6,426,653 | B1 |   | 7/2002  | Baker |
| 6,487,687 | B1 | * | 11/2002 | Blake et al. ................. 714/724 |
| 6,738,239 | B2 | * | 5/2004  | Petruska ....................... 361/23 |
| 6,781,416 | B1 |   | 8/2004  | Nguyen et al. |
| 6,911,848 | B2 | * | 6/2005  | Vinciarelli ................. 327/108 |
| 6,992,906 | B1 | * | 1/2006  | Herbert ....................... 363/127 |
| 2005/0230245 | A1 | * | 10/2005 | Morgenshtein et al. ..... 204/416 |

\* cited by examiner

*Primary Examiner*—Don Le
(74) *Attorney, Agent, or Firm*—Dolly Y. Wu; W. James Brady; Frederick J. Telecky, Jr.

(57) ABSTRACT

A driver circuit includes a first transistor coupled between an input supply node and an output node. The first transistor operates in one of a conductive state to couple the output node with the input supply node and non-conductive state according to cooperative operation of a second transistor and a third transistor. The second transistor is coupled to provide a control input to drive the first transistor to the conductive state thereof in response a first input signal provided at a control input of the second transistor. The third transistor is coupled to provide an output at the output node in response to a second input signal provided at a control input of the third transistor, the first and second input signals being out of phase with each other. Circuitry is coupled between the input supply node and the control input of the first transistor to provide reduced impedance at the control input of the first transistor according to operation of the second transistor.

17 Claims, 3 Drawing Sheets

DRIVER CIRCUIT

TECHNICAL FIELD

The present invention relates to electrical circuits and, more particularly, to a driver circuit.

BACKGROUND

Various circuits have been developed, as drivers or buffers, for use in driving high voltage devices. For instance, such drivers or buffers can be formed of low-voltage electronic circuitry, to drive high-voltage power devices, such as power metal oxide semiconductor field effect transistors (MOSFETs), insulated gate bipolar transistor devices (IGBTs), gate controlled thyristors, and the like.

The low-voltage circuitry can be coupled to apply appropriate voltages to the gate or control terminal of the power device to turn on or turn off the power device. When the power device is an N-channel metal oxide semiconductor field effect transistor (NMOSFET, also referred to as an NFET or NMOS device), the device is turned on by applying a high voltage to the gate of the power switch and turned off by applying a low voltage to the gate. In contrast, if the power device is a P-channel metal oxide semiconductor field effect transistor (PMOSFET, also referred to as a PFET or PMOS device), the device is turned on by applying a low voltage to the gate of the power switch and turned off by applying a high voltage to the gate.

As an example, FIG. 1 depicts an example of a prior art high-voltage driver 1 that can be utilized to drive an output power switch device. The driver 1 is connected to a high voltage switch device, represented as a high voltage PMOS device 2. The driver 1 includes a first NMOS device 3 that is coupled to a first differential input pin, indicated at VINB. A second NMOS device 4 is coupled to a second differential input pin, indicated at VIN (e.g., VINB=$\overline{VIN}$ relative to electrical ground). The first NMOS device 3 has its drain coupled to a PMOS device 5 of a corresponding latch device that includes another PMOS device 6. In the prior art example of FIG. 1, the NMOS device 3 is coupled with the PMOS device 5 through a cascode NMOS device 7 and a PMOS device 8. Similarly, the other NMOS device 4 is coupled to the drain of the PMOS device 6 through cascoded PMOS devices 9 and 10.

The sources of each of the PMOS devices is coupled to a supply voltage 11. The biasing devices 7, 8, 9 and 10 generally operate to mitigate the voltage across the low power NMOS device drive devices 3 and 4. In operation, when the voltage VINB goes high, the node 12 is pulled low through the biasing devices 7 and 8 and the input driver NMOS device 3. The gate of the PMOS device 6, which is a flow, activates the PMOS device 6 so that the voltage at the gate of the PMOS device 2 is pulled high to the voltage provided by the supply 11. As a result, the PMOS device 2 is off such that the output at the drain $V_{OUT\_A}$ is low. This is facilitated by the concurrent operation associated with the input VIN provided to the gate of NMOS device 4. Additionally, when VINB is low and VIN is high, similar operation occurs to pull the gate of the PMOS device 2 low such that $V_{OUT\_A}$ is high according to the voltage provided by the supply in the activation of the PMOS device 2.

During operation when the input VINB goes high the node 12 between the PMOS DEVICE 5 and the PMOS device 8 (e.g., corresponding to the drain of PMOS device 5 operates as a high impedance node. Consequently, the output PMOS device 2 may not close properly while the voltage from the supply 11 (e.g., at the source of the PMOS device 2) is changing, such as corresponding to a glitch condition. When voltage at the source of output PMOS device 2 changes in such a manner, there tends to be leakage across the PMOS device 2. This leakage can result in cross regulation, such as when multiple power devices are driving respective loads from the same supply 11. The high impedance at the node 12 thus reduces performance of the driver for a variety of applications.

SUMMARY

The present invention relates to a driver circuit. According to one aspect of the present invention, the driver circuit includes a first transistor coupled between an input supply node and an output node. The first transistor operates in one of a conductive state to couple the output node with the input supply node and non-conductive state according to cooperative operation of a second transistor and a third transistor. The second transistor is coupled to provide a control input to drive the first transistor to the conductive state thereof in response a first input signal provided at a control input of the second transistor. The third transistor is coupled to provide an output at the output node in response to a second input signal provided at a control input of the third transistor, the first and second input signals being out of phase with each other. Circuitry is coupled between the input supply node and the control input of the first transistor to provide reduced impedance at the control input of the first transistor according to operation of the second transistor.

Additional circuitry (e.g., a filter) may be coupled to the input supply node to mitigate noise from being injected from the input supply node to an output terminal that provides a regulated output based on the first and second input signals. Biasing can also be implemented to regulate current through the second and third transistors when operating in a conductive state. The driver circuit can be employed to drive a high voltage transistor having its control input connected to the output node, such as for connecting the input supply node with an output terminal. The driver circuit also mitigates cross-regulation at the input supply node, such as when more than one load or other device is coupled to receive power via the input supply node.

DETAILED DESCRIPTION

The present invention relates to a driver (or buffer) circuit that can be utilized to drive a high-voltage switch device, such as a PMOS or NMOS device, according to an aspect of the present invention. The driver circuit affords voltage protection of an output switch device as well as a reasonable amount of current consumption. Additionally, the driver circuit can provide a fast dynamic response to mitigate noise injection from the supply terminal of an associated power supply. Additionally, the driver circuit can mitigate leakage and cross regulation through an output switch device that is being driven.

Figure 1:
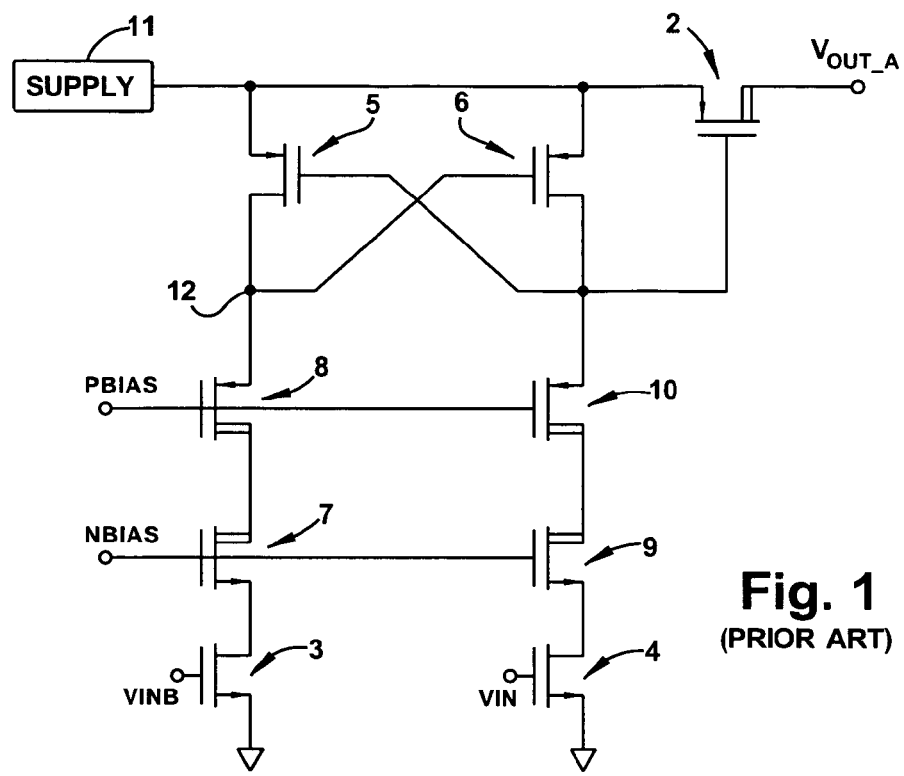
FIG. 1 depicts a prior art example of a driver circuit configured for driving field effect transistor.
Figure 2:
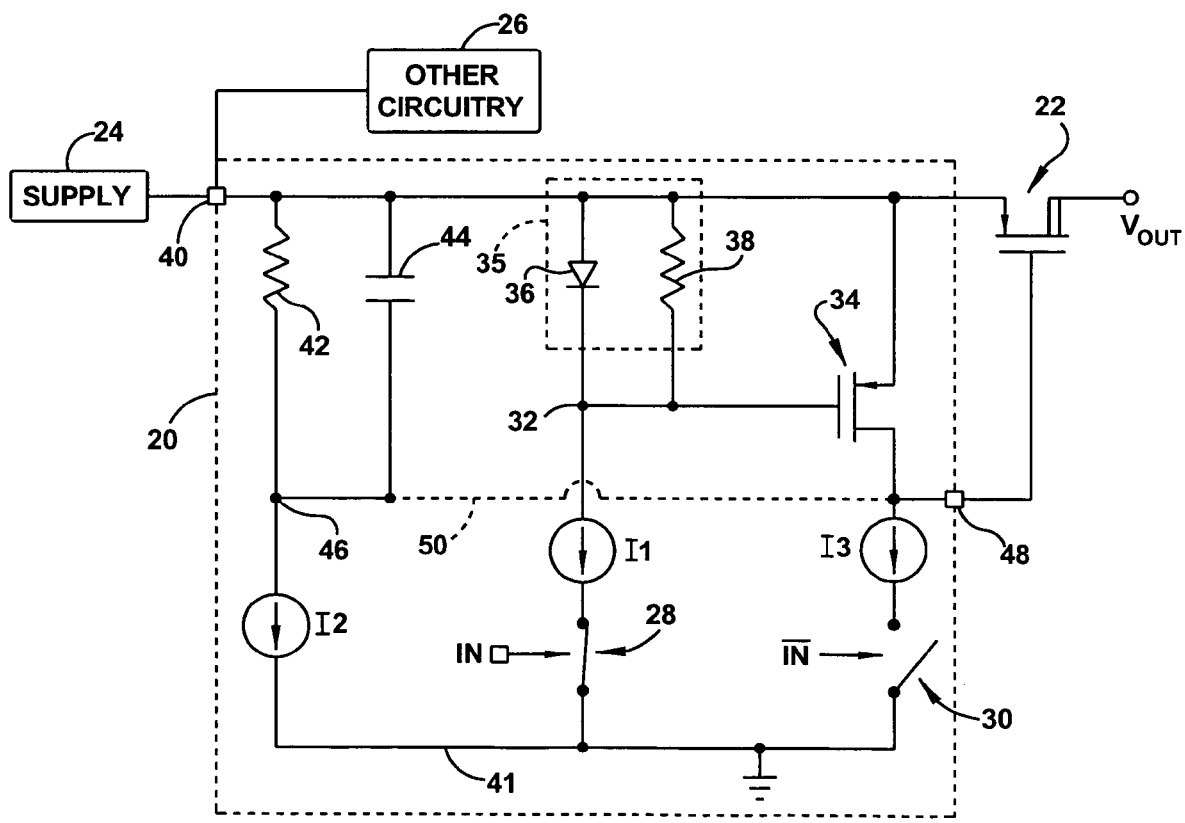
FIG. 2 depicts an example of a driver circuit configured for driving a high-voltage transistor according to an aspect of the present invention.

FIG. 2 depicts a high-level schematic diagram of a driver circuit 20 that can be implemented according to an aspect of the present invention. The driver circuit 20 is connected to drive an output power switch device, represented in FIG. 2 as a PMOS device 22. The driver circuit 20, however, is not limited in its application to driving a given type of transistor device.

The driver circuit 20 is coupled between the PMOS device 22 and an associated power supply 24. The power supply provides a signal at an input supply node 40, which defines a first power rail. In the example of FIG. 2, the driver circuit is connected to another power rail 41, depicted as electrical ground. The other power rail 41 may be at another potential, which may be higher or lower than the voltage at the input supply node. In the example of FIG. 2, the driver circuit 20 is operative to provide a control signal at an output node 48 of the driver circuit that is coupled with the gate of the PMOS device 22. The driver circuit 20 controls the PMOS device 22 in one of a conductive state or non-conductive state according to the control signal provided at 48. When the PMOS device 22 operates in the conductive state, the PMOS devices connects the input supply node 40 to the drain of the PMOS device 22 to provide a corresponding output voltage $V_{OUT}$.

Other circuitry 26 can also be coupled and powered by the supply 24 via the input supply node 40. When such other circuitry 26 is coupled to receive power via the input supply node 40, as described herein, the driver circuit 20 mitigates cross regulation that might occur at the input supply node 40. The other circuitry 26, for example, can include one or more additional driver circuits for driving one or more associated loads or other circuitry that may be powered by the supply 24. Any drivers utilized to drive an associated load that forms the other circuitry 26 may be similar to or different from the driver circuit 20.

The driver circuit 20 includes an input (IN) that is connected to control an input switch device 28. Another drive input switch device 30 is controlled inversely or complimentary relative to the switch device 28. Thus, for purposes of the illustrated example of FIG. 2, the IN input is provided to drive switch device 28 and an inverted version $\overline{\text{IN}}$ is provided to control the drive input switch device 30. The inputs IN and $\overline{\text{IN}}$ may be considered different portions of a differential input signal relative to electrical ground (or other voltage at the second power rail), for example.

The input switch device 28 is coupled to control a voltage at a node 32 corresponding to the gate of an output FET device 34. Circuitry 35 is coupled between the input supply node 40 and the node 32. A substantially constant current source I2 can be connected between the circuitry 35 and the switch device 28 to establish a substantially constant current I2 when the switch device 28 is in a conductive state. The circuitry 35 is configured to provide a low impedance node at 32 according to operation of the input switch device 28. For instance, when the switch device is 28 is in its conductive state, the current I2 is drawn through the circuitry 35 such that cross regulation at the input supply node 40 can be mitigated.

In the example of FIG. 2, the circuitry 35 includes a diode 36 and a resistor 38 connected in parallel between the input supply node 40 and the node 32. The parallel combination of the diode 36 and the resistor 38 in conjunction with the current I1 contributes to causing the voltage at the node 32 to closely track the voltage at the input supply node 40. Additionally, the circuitry 35 operates to facilitate turning off the PMOS device 34 to a non-conductive state when the switch device 28 is in a non-conductive state. For instance, when the input switch device 28 is switched to a non-conductive state, the circuitry 35 (including diode 36 and resistor 38) pulls the node 32 up to approximate the voltage at the input supply node 40. This effectively reduces the gate-to-source voltage ($V_{GS}$) of the PMOS device 34 such that the PMOS device 34 switches to a non-conductive state.

The driver circuit 20 can also include an RC filter formed of resistor 42 and capacitor 44 connected in parallel between the input supply node 40 and an internal node 46. The filter 42 and 44 can be driven with a substantially constant current indicated at I2. The substantially constant current I2 causes the voltage at node 46 between the resistor 42 and the current source I2 to track the voltage at the input node 40 because of the voltage across the resistor 42 is substantially constant. The substantially constant voltage across the resistor 42 further helps protect the maximum voltage rating for other circuitry of the driver 20, including, the diode 36, the PMOS device 34 as well as the output PMOS device 22.

In operation, when the input signal IN closes the switch device 28, the voltage at node 32 is pulled low (e.g., to about electrical ground). Additionally, the current I1 flows from node 32 to ground through the switch device 28. As described herein, biasing can be implemented to control the current I1 so that the driver exhibits reasonable current consumption. As a result, the node 32 provides a low impedance node, which mitigates cross regulation of the voltage at the input supply node 40. Additionally, the low voltage at the node 32 operates to activate the PMOS device 34 to a conductive state such that the output node 48 is pulled up to about the voltage at the supply node 40. The high voltage at the output node 48 causes a $V_{GS}$ at the PMOS device 22 to operate the PMOS device 22 in a non-conductive state so that the output $V_{OUT}$ is disconnected from the input supply node 40. The operation and control of the voltage at the output node 48 is facilitated by the complimentary operation of the switch device 30 in response to the input signal $\overline{\text{IN}}$. That is, the switch device 30 operates in a non-conductive state when the switch device 28 operates in a conductive state.

The PMOS device 22 operates in a conductive state in response to the switch device 28 operating in a non-conductive state and the switch device 30 operating in a conductive state. For example, when the input IN signal goes low (and the $\overline{\text{IN}}$ signal goes high), the drive switch device 28 opens to a non-conductive state and the input drive switch device 30 closes to a conductive state. In response to the non-conductive state of the switch device 28, the voltage at the node 32 is pulled high through the circuitry 35, corresponding to the voltage at the input supply node 40. The high voltage at the node 32 causes the PMOS device 34 to operate in a non-conductive state. Concurrently with the switch device 28 being turned off to a non-conductive state, the other input switch device 30 closes to operate in a conductive state. In the conductive state, the switch device 30 pulls the output node 48 low (e.g., to about the second power supply rail 41). Another current source can draw a substantially constant current I3 through the switch device when operating in a conductive state. Since the output node 48 is low, the output PMOS device 22 is activated to a conductive state and the voltage at the input node 40 is provided to the output $V_{OUT}$.

As an example, if the output PMOS device 22 is implemented as a drain extended PMOS, the VGS may be approximately 3.6 V. The voltage at the output node 48 can be protected by the voltage at the node 46, which follows the voltage at the input supply node 40 due to the substantially constant voltage drop across the resistor 42. This protection is schematically indicated by a dotted line 50. The protection, for example, can be implemented by the voltage at the node 46 controlling operation of a transistor or other switch device (not shown) that is connected in series with the switch device 30.

Figure 3:
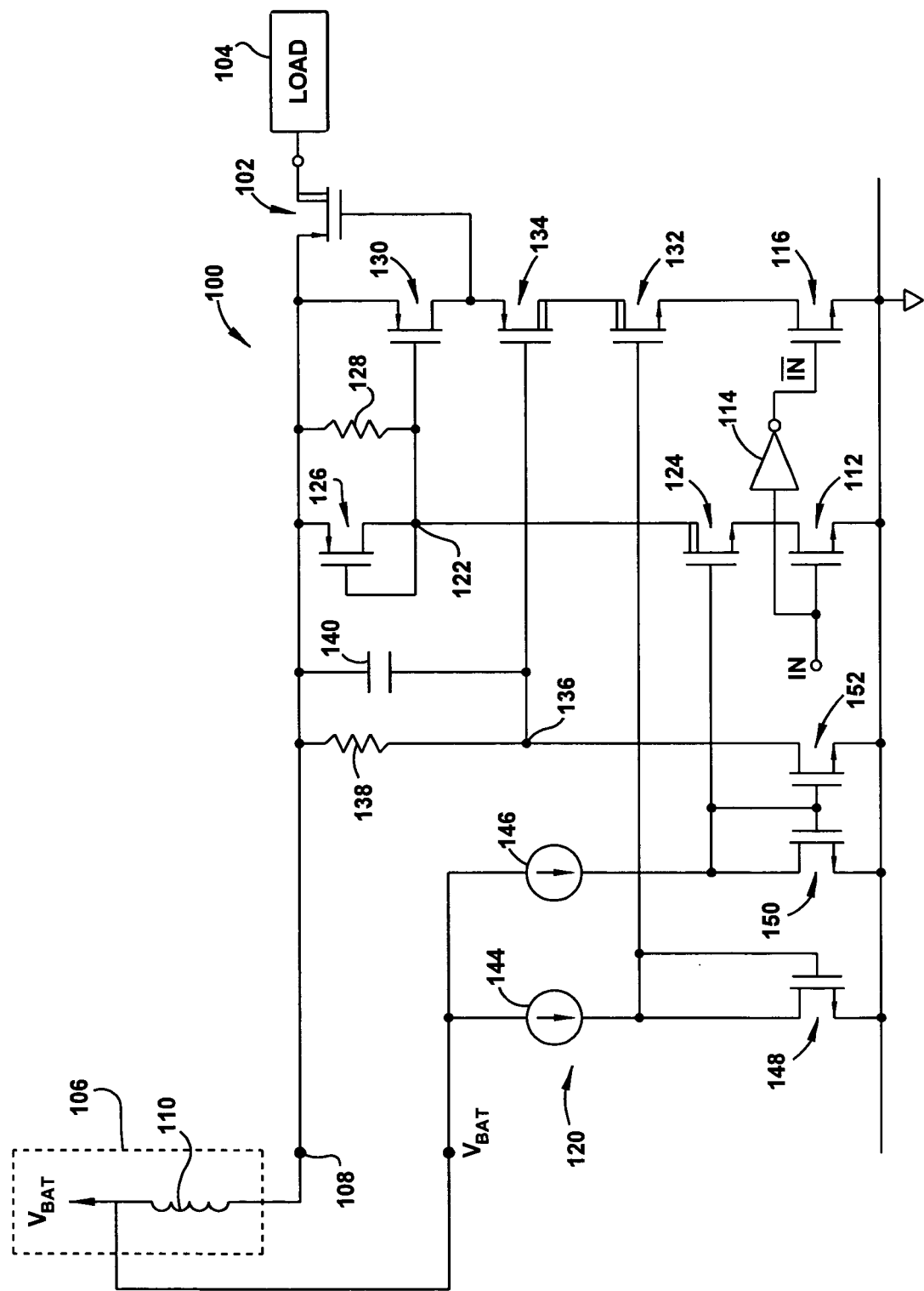
FIG. 3 depicts an example of another driver circuit configured for driving a high-voltage transistor according to an aspect of the present invention.

By way of further example, FIG. 3 is an example of a driver circuit 100 that can be utilized to drive an output PMOS device 102 according to an aspect of the present invention. It is to be understood that the circuit 100 can be configured to drive other types of transistor devices. In the example of FIG. 3, the output PMOS device 102 is a drain-extended MOSFET transistor, which can sustain a drain to source voltage ($V_{DS}$) up to approximately 20 V. When the output PMOS device 102 is in a conductive state, the maximum $V_{GS}$ rating is approximately 3.6 V. Transistors having other voltage ratings can also be used.

In FIG. 3 and other figures illustrated herein, a drain extended transistor is depicted as having a double line at the drain terminal. A drain extended PMOS device can be utilized as the output PMOS device 102 when high power that is to be supplied to an associated load 104 that can be connected at the drain of the device. This large output voltage can be supplied from a power supply 106 connected at an input node 108. Thus, the output PMOS device 102 is connected between the input node (e.g., corresponding to a first supply rail) 108 and the load 104, with the driver system 100 controlling the output PMOS device 102, as described herein.

In the example of FIG. 3, the supply 106 can include an inductor coupled 110 to a battery voltage, indicated at $V_{BAT}$. Those skilled in the art will understand and appreciate that other types of power supplies can be utilized to supply power to the load 104. Additionally, the supply 106 can be connected to supply power to other loads (not shown), such as through drain extended transistors. Thus, one or more additional instances of the driver circuit 100 can be implemented to drive such other output transistors and associated loads The driver system 100 controls the output PMOS device 102 in response to an input signal IN that is provided at the gate at NMOS device 112. The input signal IN also is provided through an inverter 114 (corresponding to $\overline{IN}$) to the gate of another NMOS device 116. The input NMOS devices 112 and 116 cooperate to facilitate transitioning the output PMOS device 102 between conductive and non-conductive states. In particular, each of the NMOS devices 112 and 116 regulate current flow in the driver system 100 so as to achieve appropriate activation and deactivation and voltage protection of the output PMOS device 102. The driver system 100 also exhibits a reasonable current consumption based on a current mirror system 120 that is utilized to establish current throughout the driver circuit system 100. The input NMOS device 112 is connected to an internal node 122 through a corresponding drain extended NMOS device 124. The NMOS device 124 regulates current flow from the node 122 based on the current established by the current mirror network 120.

Circuitry is connected between the input node 108 and the internal node 122 to provide a low impedance node at 122 according to operation of NMOS device 112. In the example of FIG. 3, the circuitry includes a diode-connected PMOS device 126 that is connected in parallel with a resistor 128 between the input node 108 and the internal node 122. The internal node 122 corresponds to the gate of a PMOS device 130. The PMOS device 130 has its source connected to the input node 108 and its drain connected to the gate of the output PMOS device 102. The voltage at the internal node 122 depends on the input signal IN that is provided to the gate of the NMOS device 1 12, which enables the low impedance node at 122 to exist when the NMOS device 112 operates in a conductive state.

For example, when the input IN signal is high, the NMOS device 112 is turned on to operate with the PMOS device 124 in regulating current from the node 122 through the PMOS device 124 and the NMOS device 112. Accordingly, assuming that the NMOS device 112 operates in saturation, the high input IN signal results in a substantially regulated constant current being pulled through the devices 124 and 112, such that the voltage at the node 122 is low. The low voltage at the node 122 in conjunction with the diode connected PMOS 126 and resistor 128 establishes reduced impedance at the node 122, which mitigates cross regulation at the node 108. The low voltage at 122 results in a corresponding low $V_{GS}$ voltage of the PMOS device 130, which causes the PMOS device 130 to operate in a conductive state. When the PMOS device 130 operates in a conductive state, the drain of the PMOS device 130 is pulled high up to about the supply voltage at the input node 108 (less the source-to-drain voltage, $V_{DS}$, across the PMOS device 130). The high voltage at the drain of the PMOS device 130, which is coupled to the gate of the output PMOS device 102, causes the output PMOS device 102 to operate in a non-conductive state. Additionally, when the input NMOS device 112 is activated to a conductive state, the other input NMOS device 116 is in a non-conductive state, which facilitates achieving the high voltage at the drain of the output PMOS device 130 so that the output PMOS device 102 is off.

The input NMOS device 116 is connected to the drain of the output PMOS device 130 through drain extended NMOS devices 132 and drain extended PMOS device 134. The NMOS device 132 is operative to protect the NMOS device 116 so that the NMOS device can be implemented as a low voltage rating. The PMOS device 132 also helps regulate current through the NMOS device 116 when operated in a conductive state. That is, the NMOS device 132 is coupled with the current mirror network 120 for achieving a substantially constant current through activation of the NMOS device 116. The PMOS device 134 has its gate connected with another internal node 136. The node 136 is connected to the input node 108 through a parallel connection of a resistor 138 and capacitor 140, which defines an RC filter. The current mirror network 120 causes a substantially constant current to be drawn from the node 136. The voltage at the node 136 thus tracks the voltage at the input node 108 based on a substantially constant voltage drop that occurs across the resistor 138. The RC filter can be tuned as a high-pass filter to mitigate injection of high frequency components to the load 104.

When the input signal IN goes low and $\overline{IN}$ goes high, for example, the NMOS device 116 is activated to a conductive state. In the conductive state, the NMOS device 132 establishes a substantially constant current through the NMOS device 116 and NMOS device 132 based on the reference provided at the gate of the NMOS device 132 by the current mirror network 120. The PMOS device 134 is also activated to a conductive state such that the gate of the output PMOS device 102 is pulled low through the series combination of devices 134, 132 and 116. The activation of the PMOS device 134 further can vary as a function of the voltage at node 136, which as mentioned above voltage tracks the input voltage. This relationship thus can control the PMOS device 134 to vary the voltage at the source of the PMOS device 134 (also coupled to the gate of the output PMOS device 102) so as to mitigate spikes or variations in the voltage at the input node 108 from being injected through the output PMOS device 102. That is, the PMOS devices 134 and 132 cooperate to control the transient current and to facilitate proper activation of the output PMOS device 102 to its conductive state.

Additionally, when the NMOS device 112 is deactivated to a nonconductive state in response to the input signal IN, the voltage at the internal node 122, as provided through the parallel combination of diode-connected transistor 126 and resistor 128, pull the gate of the PMOS device 130 high to operate the PMOS device 130 in a non-conductive state (turned off). Concurrently with the PMOS device 130 operating in a non-conductive state, the devices 116, 132 and 134 operate in a conductive state, which results in the gate of the output PMOS device 102 device being pulled low. That is, the cooperation between high-side and low-side circuitry enables the driver system 100 to provide a fast dynamic response as a function of the input signal IN (and $\overline{IN}$) for controlling the output that is provided at the gate of the output PMOS device 102.

From the foregoing, it is to be understood and appreciated that the input NMOS devices 112 and 116 cooperate in a complimentary manner to control the conductive state of the output of the PMOS device. Additionally, glitches and cross regulation that may occur at the input node 108 are mitigated by providing a low impedance internal node 122 when the output PMOS device 102 operates in a non-conductive state. This proves particularly useful when additional loads may be coupled and driven by the voltage provided at the input node 108. The constant voltage across the resistor 138 also helps protect the maximum voltage rating for the power PMOS device 102 as well as for PMOS devices 126 and 130. The RC filter 138 and 140 also mitigates noise, such as corresponding to glitches or other transient events, from being injected from the input node 108 through the output PMOS device 102 and to the load 104.

In the example of FIG. 3, the current mirror network 120 is configured to provide reasonable power consumption. The current mirror network 120 includes current sources 144 and 146 connected to the battery voltage $V_{BAT}$. The current source 144 is connected through diode-connected transistor 148 to electrical ground. The drain of transistor 148 is connected to control the gate of NMOS device 132 to establish a desired substantially fixed current through the NMOS device 132 when the NMOS device 116 operates in a conductive state (e.g., when $\overline{IN}$ is high). The current source 146 drives another portion of the current mirror network 120 by providing substantially constant current to a diode connected PMOS device 150. The gate and drain of device 150 are connected to the gate of the PMOS device 124, which is utilized to provide the desired substantially fixed bias current when the NMOS device 112 is activated to a conductive state. Additionally, the drain of PMOS device 150 is also connected to the gate of PMOS device 152 for biasing the PMOS device to establish the substantially constant current, which is pulled from the node 136. Those skilled in the art will understand that the current mirror network 120 and resulting bias currents can be tuned to desired levels, such as by configuring the relative sizes of the respective transistor devices.

Figure 4:
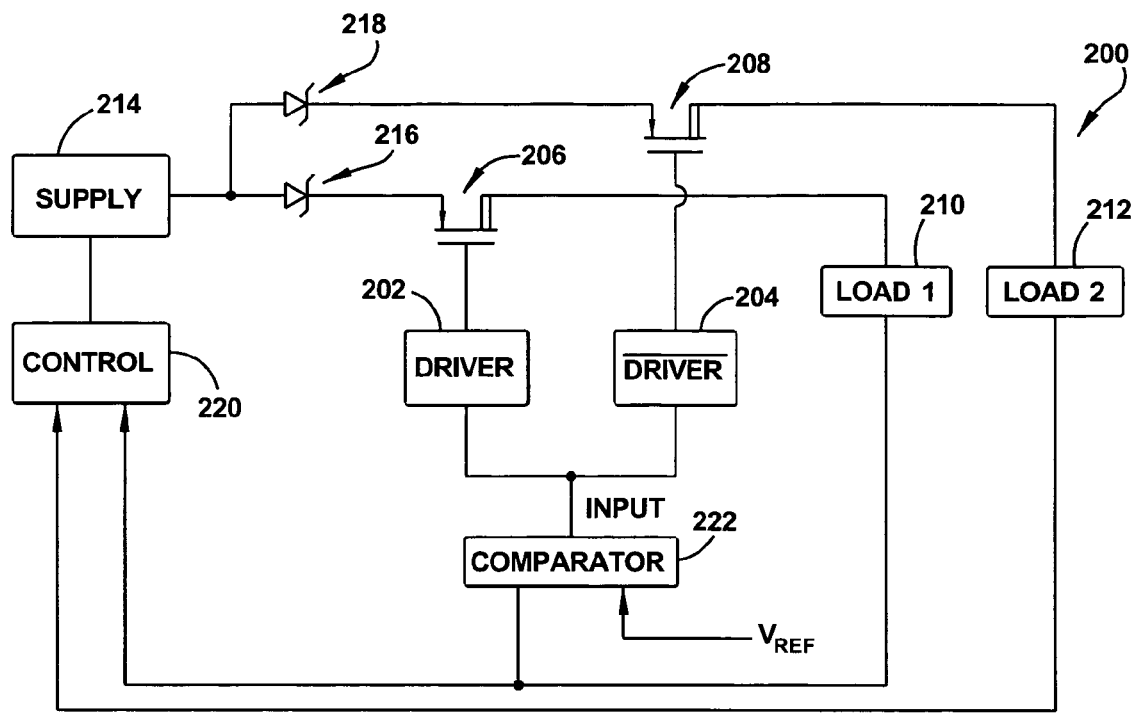
FIG. 4 depicts a block diagram of a DC/DC converter employing multiple drivers configured according to an aspect of the present invention.
Figure 5:
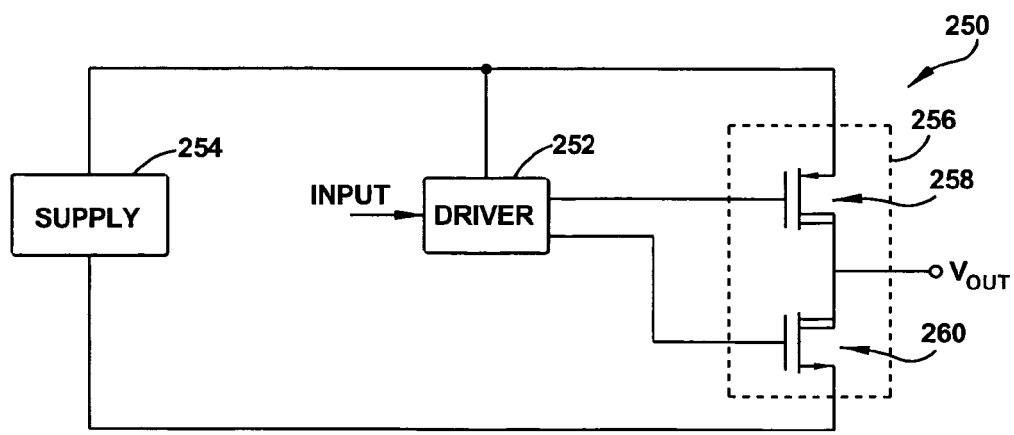
FIG. 5 depicts a block diagram of another DC/DC converter employing a driver configured according to an aspect of the present invention.

A driver circuit implemented according to an aspect of the present invention is particularly useful in driving the gates of output transistor devices, such as are commonly utilized in DC/DC converters. FIGS. 4 and 5 depict two example implementations of DC/DC converter systems that can utilize a driver according to an aspect of the present invention. In FIG. 4, a dual output DC/DC converter 200 employs a pair of drivers 202 and 204 implemented according to an aspect of the present invention. Each driver 202, 204 is coupled to a gate of a corresponding PMOS device 206 and 208, respectively. For example, each of the PMOS devices 206 and 208 can be implemented as drain extended PMOS field effect transistors. Each of the PMOS devices 206 and 208 is coupled to supply electrical energy to an associated load (LOAD 1) 210 and (LOAD 1) 212. In order to provide desired power to the respective loads 210 and 212, the drivers 202 and 204 operate mutually exclusively in response to a corresponding INPUT signal.

It is to be appreciated that the driver circuits 202 and 204 shown and described herein can be implemented with different devices and arranged to provide complementary signals in response to the INPUT signal based on the teachings contained herein. For example, such implementation can be achieved by configuring one driver circuit relative to a positive supply and other relative to electrical ground or other lower voltage potential.

The DC/DC converter 200 includes a supply 214 that provides an input voltage and current to the converter. The supply 214, for example can be implemented as an inductor coupled to an input voltage, such as a battery. The current through the inductor can be utilized to supply electrical current through the output PMOS devices 206 and 208 for providing current to drive the respective loads 210 and 212.

Each of the PMOS devices 206 and 208 is connected with an input supply terminal through corresponding diodes, depicted as Schottky diodes 216 and 218. Feedback signals are obtained from the respective loads 210 and 212 and fed back to a control system 220. The control system 220 can be utilized to control the amount of current that is delivered by the supply 214 SO that the desired amount of electrical current can be delivered to the loads 210 and 212 by appropriate activation of the PMOS devices 206 and 208.

A comparator can be coupled to the feedback from one or both of the loads 210 and 212. A comparator 222 compares the feedback relative to the corresponding reference voltage indicated at $V_{REF}$, to provide the corresponding input signal to the drivers 202 and 204. The relationship of the control system 220 and the comparison by the comparator 222 enables the drivers 202 and 204 to selectively activate each of the respective PMOS devices 206 and 208 to a conductive state so that regulated electrical energy is delivered to each of the respective loads 210 and 212 to maintain desired operation therein. As one example, each of the loads 210, 212 can include a number of one or more light emitting diodes that provide a substantially constant illumination according the regulated DC voltage provided by the DC/DC converter system 200.

FIG. 5 depicts an example of a DC/DC buck converter 250 employing a driver 252 according to an aspect of the present invention. A power supply (e.g., a battery) 254 is coupled to the driver 252 and to a network (e.g., a half H-bridge) 256 of output transistors 258 and 260. An output is taken at the interconnected drains of the respective transistors 258 and 260 for providing a corresponding output voltage, indicated at $V_{OUT}$. The driver 252 provides a control signal to the gate of each of the respective transistors 258 and 260. The control signals can be the same or different voltage levels depending on the type and arrangement of the transistor network 256. For example, if the transistors 258 and 260 are implemented, respectively, as a PMOS device and a NMOS device, the driver 252 can provide the same voltage level at the gates of the transistors 258 and 260 to operate the devices. By way of reference to the driver 100 depicted in FIG. 3, for example, the output to the gate of the PMOS device 258 can correspond to the output provided at the node between PMOS devices 130 and 134 of FIG. 3. The other output of the driver 252 that is provided to the gate of the NMOS device 260 can correspond to a node connected between PMOS device 132 and NMOS device 116 of FIG. 3. Since the outputs are separated by PMOS devices 134 and 132 switching noise at the output $V_{OUT}$ can be mitigated. Those skilled in the art will understand and appreciate various other DC/DC converter systems and other power applications that can utilize a driver implemented according to an aspect of the present invention. The examples of FIGS. 4 and 5 have been provided for purposes of example and not by way of limitation.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A driver circuit comprising:
   a first transistor coupled between an input supply node and an output node, the first transistor operating in one of a conductive state to couple the output node with the input supply node and non-conductive state according to cooperative operation of a second transistor and a third transistor;
   the second transistor coupled to provide a control input to drive the first transistor to the conductive state thereof in response a first input signal provided at a control input of the second transistor;
   the third transistor coupled to provide an output at the output node in response to a second input signal provided at a control input of the third transistor, the first and second input signals being out of phase with each other;
   circuitry coupled between the input supply node and the control input of the first transistor to provide reduced impedance at the control input of the first transistor according to operation of the second transistor; and
   wherein the circuitry further comprises a diode connected in parallel with a resistor between the input supply node and the control input of the first transistor.

2. A driver circuit comprising:
   a first transistor coupled between an input supply node and an output node, the first transistor operating in one of a conductive state to couple the output node with the input supply node and non-conductive state according to cooperative operation of a second transistor and a third transistor;
   the second transistor coupled to provide a control input to drive the first transistor to the conductive state thereof in response a first input signal provided at a control input of the second transistor;
   the third transistor coupled to provide an output at the output node in response to a second input signal provided at a control input of the third transistor, the first and second input signals being out of phase with each other;
   circuitry coupled between the input supply node and the control input of the first transistor to provide reduced impedance at the control input of the first transistor according to operation of the second transistor; and
   further comprising a filter connected between the input supply node and an intermediate mode, a substantially constant current being drawn through the filter to provide a corresponding voltage at the intermediate node.

3. The driver circuit of claim 2, further comprising a protection transistor coupled between the first transistor and the third transistor, the protection transistor operating in a state that varies according to the corresponding voltage at the intermediate node.

4. A driver circuit comprising:
   a first transistor coupled between an input supply node and an output node, the first transistor operating in one of a conductive state to couple the output node with the input supply node and non-conductive state according to cooperative operation of a second transistor and a third transistor;
   the second transistor coupled to provide a control input to drive the first transistor to the conductive state thereof in response a first input signal provided at a control input of the second transistor;
   the third transistor coupled to provide an output at the output node in response to a second input signal provided at a control input of the third transistor, the first and second input signals being out of phase with each other;
   circuitry coupled between the input supply node and the control input of the first transistor to provide reduced impedance at the control input of the first transistor according to operation of the second transistor; and
   further comprising a biasing transistor coupled between the output node and the third transistor, the biasing transistor being operated to draw a substantially fixed current from the output node through the biasing transistor and the third transistor when the third transistor operates in the conductive state.

5. The driver circuit of claim 4, further comprising a biasing transistor coupled between the circuitry and the second transistor, the biasing transistor being operated to draw a substantially fixed current from the control input of the first transistor and through the biasing transistor and the second transistor when the second transistor operates in the conductive state.

6. A driver circuit comprising:
   a first transistor coupled between an input supply node and an output node, the first transistor operating in one of a conductive state to couple the output node with the input supply node and non-conductive state according to cooperative operation of a second transistor and a third transistor;
   the second transistor coupled to provide a control input to drive the first transistor to the conductive state thereof in response a first input signal provided at a control input of the second transistor;
   the third transistor coupled to provide an output at the output node in response to a second industrial provided at a control input of the third transistor, the first and second input signals being out of phase with each other;

circuitry coupled between the input supply node and the control input of the first transistor to provide reduced impedance at the control input of the first transistor according to operation of the second transistor; and further comprising an output transistor connected between the input supply node and an output terminal, the output transistor having a control input coupled to the output node so that the output transistor is activated in one of a conductive state and a non-conductive state according to operation of the second and third transistors, the circuitry mitigating injection of at least one of noise and cross-regulation at the input supply node relative to the output terminal.

7. The driver circuit of claim 6, wherein the output transistor comprises a drain extended field effect transistor.

8. A DC/DC converter comprising at least one driver circuit the driver circuit comprising:

a first transistor coupled between an input supply node and an output node, the first transistor operating in one of a conductive state to couple the output node with the input supply node and non-conductive state according to cooperative operation of a second transistor and a third transistor;

the second transistor coupled to provide a control input to drive the first transistor to the conductive state thereof in response a first input signal provided at a control input of the second transistor;

the third transistor coupled to provide an output the output node in response to a second input signal provided at a control input of the third transistor, the first and second input signals out of phase with each other;

circuitry coupled between the input supply node and the control input of the first transistor to provide reduced impedance at the control input of the first transistor according to operation of the second transistor; and the DC/DC converter further comprising at least one field effect transistor connected between the input supply node and an output terminal, the at least one field effect transistor having a gate coupled to the output node to provide a regulated output to a load based on the first and second input signals.

9. A driver circuit comprising:

a first transistor coupled between a first power rail and an output node, the first transistor operating in one of a conductive state to couple the output node with the first power rail and non-conductive state according to a first control input signal provided at a control input of the first transistor;

a second transistor coupled between the control input of the first transistor and a second power rail, the second power rail being at a potential that that is one of higher or lower than the first power rail, the second transistor being operative to provide the first control input signal to the control input of the first transistor based on a state of a logic input signal provided at a control input of the second transistor, the state of the logic input signal controlling operation of the second transistor;

a third transistor coupled in series with the first transistor between the output node and a second power rail, the third transistor operating in one of a conductive state to couple the output node with second power rail based on the state of the logic in out signal;

circuitry coupled between the first power rail and the control input of the first transistor to provide reduced impedance at the control input of the first transistor relative to the first power rail according to the operation of the second transistor; and a DC/DC converter comprising the driver circuit, the DC/DC converter further comprising at least one field effect transistor connected between the first power rail and an output terminal, the at least one field effect transistor having a gate coupled to output node and providing a regulated output at the output terminal based on the logic input signal.

10. The driver circuit of claim 9, wherein the circuitry further comprises a diode connected in parallel with a resistor between the first power rail and the control input of the first transistor.

11. The driver circuit of claim 9, further comprising:

a filter connected between the input supply node and an intermediate node, a substantially constant current being drawn through the filter to provide a corresponding voltage at the intermediate node; and a fourth transistor coupled in series with the first transistor between the output node and the second power rail, the fourth transistor operating in a state that varies according to the corresponding voltage at the intermediate node.

12. The driver circuit of claim 11, further comprising a fifth transistor coupled in series with the first transistor, the third transistor and the fourth transistor between the output node and the second power rail, the fifth transistor being controlled to draw a substantially fixed current from the output node to the second power rail when the third transistor operates in the conductive state.

13. The driver circuit of claim 12, further comprising a sixth transistor coupled in series with the second transistor between the control input of the first transistor and the second power rail, the sixth transistor being controlled to draw a substantially fixed current from the control input of the first transistor to the second power rail when the second transistor operates in the conductive state, the second transistor operating in the conductive state mutually exclusively with the third transistor operating in the conductive state.

14. The driver circuit of claim 13, further comprising an output transistor connected between the first power rail and an output terminal, the output transistor having a control input coupled to the output node such that the output transistor is activated in one of a conductive and non-conductive states according to operation of the second and third transistors, the circuitry mitigating injection of at least one of noise and cross-regulation at the input supply node relative to the output terminal.

15. The drive circuit of claim 14, wherein the output transistor comprises a drain extended field effect transistor.

16. A DC/DC converter comprising:

means for supplying power to a first rail;

first switch means, coupled between a first power rail and an output node, for operating in one of a conductive state to couple the output node with the first power rail and non-conductive state according to a first signal provided at a control input of the first switch means;

second switch means for providing the first control input signal to the control input of the first transistor based on a state of a logic input signal provided at a control input of the second switch means, the state of the logic input signal controlling operation of the second transistor, the second switch means being coupled in series between the control input of the first switch means and a second power rail, the second power rail being at a potential that that is one of higher or lower than the first power rail:

third switch means, coupled in series with the first transistor between the output node and a second power rail, for operating in one of a conductive state to couple the output node with second power rail, or a non-conductive state based on the state of the logic input signal;
means for providing reduced impedance at the control input of the first transistor relative to the first power rail according to the operation of the second transistor; and
fourth switch means, connected between the first power rail and an output terminal, for providing a regulated output at an output terminal of the DC/DC converter based on the logic input signal, the fourth switch means having a control input coupled to the output node.

17. The DC/DC converter of claim 16, further comprising means for mitigating transient signals at the first power rail.

* * * * *